United States Patent [19]

Harada et al.

[11] 4,143,178
[45] Mar. 6, 1979

[54] MANUFACTURING METHOD OF SEMICONDUCTOR DEVICES

[75] Inventors: Nozomu Harada; Nobuhisa Kubota, both of Yokohama, Japan

[73] Assignee: Tokyo Shibaura Electric Co., Ltd., Kawasaki, Japan

[21] Appl. No.: 813,464

[22] Filed: Jul. 7, 1977

[30] Foreign Application Priority Data

Jul. 7, 1976 [JP] Japan .................. 51-79821

[51] Int. Cl.² .................. H01L 21/225; B05D 5/12
[52] U.S. Cl. .................. 427/85; 148/174; 148/187; 148/188; 148/191; 427/248 R; 427/248 E; 427/399
[58] Field of Search .................. 427/85, 399, 248 R, 427/248 E; 357/59; 148/174, 187, 188, 191, 1.5

[56] References Cited

U.S. PATENT DOCUMENTS

| | | | |
|---|---|---|---|
| 3,460,007 | 8/1969 | Scott, Jr. | 317/59 |
| 3,651,385 | 3/1972 | Kobayash | 317/59 |
| 3,873,371 | 3/1975 | Wolf | 427/85 |
| 3,969,168 | 7/1976 | Kuhn | 427/85 |
| 4,001,861 | 1/1977 | Carner | 357/59 |

Primary Examiner—Michael F. Esposito
Attorney, Agent, or Firm—Oblon, Fisher, Spivak, McClelland & Maier

[57] ABSTRACT

A manufacturing method of semiconductor device having a single layer or multilayer of polycrystalline semiconductor including doped impurity is provided which comprises a step of forming a first polycrystalline semiconductor layer with doped impurity on a semiconductor substrate and another step of forming a second polycrystalline semiconductor layer without doped impurity on the first polycrystalline semiconductor layer. The manufacturing method of the invention provides excellent MOS FET's in the semiconductor device of which the threshold voltage varies little. High reliable semiconductor device may further be manufactured with a high yield.

5 Claims, 13 Drawing Figures

MANUFACTURING METHOD OF SEMICONDUCTOR DEVICES

BACKGROUND OF THE INVENTION

The present invention relates to a manufacturing method of semiconductor devices each having a single layer or multilayer of polycrystalline silicon doped with impurity.

It is known that polycrystalline silicon with doped impurity is used as gates or internal wiring in MOS IC or LSI. It is for this reason that, in manufacturing MOS FET's, for example, the natures of low conductivity, good thermal resistivity and easy processing of such the polycrystalline silicon enable source, drain and gate to be self-aligned. At the initial stage of development of MOS IC and LSI using such the polycrystalline silicon, a single layer of the polycrystalline silicon was used; however, multilayers of the polycrystalline silicon have been increasingly used recently, in order to improve the integration density of the circuits.

Reference will be made to FIGS. 1A to 1C illustrating conventional devices with double layers or polycrystalline silicon including doped impurity.

FIG. 1A shows a cross sectional view of an overlapping type charge coupled device in which the transfer electrodes made of two layer of polycrystalline silicon with doped impurity are partly overlapped in disposition. As shown in FIG. 1A, first gate oxide layers 2a, 2b and 2c and second gate oxide layers 3a and 3b are provided on a substrate 1 of p-type single crystalline silicon. First polycrystalline silicon electrodes 4a, 4b and 4c each doped with impurity are formed on the first gate oxide layers 2a, 2b and 2c. Second polycrystalline silicon layers 5a and 5b each doped with impurity on the second gate oxide layers 3a and 3b. The first polycrystalline silicon electrodes 4a, 4b and 4c and the second polycrystalline silicon electrodes 5a and 5b are electrically insulated by an oxide layer 6 inserted therebetween.

FIG. 1B shows a cross sectional view of one cell of a transistor type dynamic random access memory having electrodes of the double layer polycrystalline silicon. The memory comprises storage elements each keeping charges therein representing logical "1" or "0" and transistors serving each as a switching element for transfer the charges stored in the storage element to the corresponding bit line for detection. As shown in FIG. 1B, a first gate oxide layer 8 and a second gate oxide layer 9 are formed on a p-type silicon monocrystalline silicon substrate 7, for example. These layers are surrounded by field oxide layers 10a and 10b. A first polycrystalline silicon electrode 11 doped with impurity is provided on the first gate oxide layer 8. The first polycrystalline silicon electrode 11 constitutes an electrode for the storage element of the dynamic random access memory. A second polycrystalline silicon electrode 12 with doped impurity is formed on the second gate oxide layer 9. The second polycrystalline silicon electrode 12 constitutes a gate of the switching transistor of the dynamic random access memory. The first polycrystalline silicon electrode 11 and the second polycrystalline silicon electrode 12 are electrically insulated by an oxide layer 13. The second polycrystalline silicon electrode 12 is connected to a metal line 15 of, for example, aluminum serving as a word line.

FIG. 1C shows a cross sectional view of one cell of an avalanche injection MOS memory of double polycrystalline silicon layers type. As shown in FIG. 1C, a first gate oxide layer 17 is formed on a p-type silicon monocrystalline silicon substrate 16, with a first polycrystalline silicon electrode 18 of a floating gate further formed on the first gate oxide layer 17. A second polycrystalline silicon electrode 20 is formed on the first polycrystalline silicon electrode 18 with an oxide layer 19 inserted therebetween for electrical insulation. The second polycrystalline silicon electrode 20 serves as a control gate. These first and second polycrystalline silicon electrodes are both doped with impurity. A source and a drain diffusion layers 21a and 21b are formed in the surface layer of the substrate 16, being disposed on both the lower sides of the first polycrystalline silicon electrode 18.

In the above-mentioned three devices with doped polysilicon double layers, the interface between the first and second (although not shown in FIG. 1C) gate oxide layers and the substrate, and its vicinity must be well conditioned physically and electrically. As a matter of course, there are many other examples of the device with polycrystalline silicon double layers, in addition to the above enumerated ones.

The explanation to follow with reference to FIGS. 2A to 2E is a conventional manufacturing method of the FIG. 1A device.

As shown in FIG. 2A, to start, a first gate oxide layer 23 is formed on a p-type monocrystalline silicon layer 22, for example. Then, the entire surface of the first gate oxide layer 23 is covered with a polycrystalline silicon layer 24. Into this polycrystalline silicon layer 24, a dopant, such as phosphorus or boron, is diffused to reduce the conductivity of the polycrystalline silicon layer 24. At the next step, photoresist layers 25a, 25b and 25c are patterned, by the photolithography, on the polycrystalline silicon layer 24 corresponding to the first polycrystalline silicon electrodes 4a, 4b and 4c shown in FIG. 1A. As shown in FIG. 2B, the polycrystalline silicon layer 24 is not covered with the photoresist layers is removed by, for example, the plasma etching method, using the photoresist layers 25a, 25b and 25c as an etching mask. This step forms first polycrystalline silicon electrodes 26a, 26b and 26c. After removal of the photoresist layers 25a, 25b and 25c, the first gate oxide layer 23 is removed by the oxide etching method using, for example, ammonium fluoride (NH$_4$F), with the etching mask of the first polycrystalline silicon electrodes 26a, 26b and 26c, as shown in FIG. 2C. This removal step is conducted leaving only the first gate oxide layers 27a, 27b and 27c under the first polycrystalline silicon electrodes 26a, 26b and 26c. Following this, the device thus far fabricated is thermal-oxided in a high temperature oxide atmosphere, with the result that the second gate oxide layers 28a, 28b and 28c are formed on the substrate 22 and oxide layers 29a, 29b and 29c are formed on the first polycrystalline silicon electrodes 26a, 26b and 26c. See FIG. 2D. Then, as in the step for forming the first polycrystalline silicon electrodes 26a, 26b and 26c, second polycrystalline silicon electrodes 30a, 30b and 30c are formed.

The conventional manufacturing method of the overlapping type charge coupled device with polycrystalline silicon double layers doped with impurity. Thus far described, however, is problematic in the step for manufacturing the second gate oxide layers 28a, 28b and 28c. The formation of the second gate oxide layers 28a, 28b and 28c is conducted through the oxidation in a high temperature oxide atmosphere in a state that the surfaces of the first polycrystalline silicon electrodes 26a, 26b and 26c and some portions of the substrate 22 surface are exposed. In this case, at the initial stage of the oxidation in the high temperature oxide atmosphere, the doped impurity is evaporated from the first polycrystalline silicon electrodes 26a, 26b and 26c, and sticks onto the exposed surface of the substrate 22 or the wall of an oxidation tube. The impurity stuck to the surface of the substrate 22, then, is diffused into the substrate by heating, so that it changes the inversion voltage of the MOS capacitor thereat. The impurity attached onto the wall of the oxidation tube is evaporated again to attach onto the substrate surface and a similar process is repeated to the substrate, with similar results.

Such the evaporation, attaching and diffusion of impurity when the random access memory as shown in FIG. 1B is manufactured, cause the threshold voltage of the switching transistor to change. The phenomena also cause change of the threshold voltages of the MOS FET's in the elements or circuits shown in FIGS. 1A to 1C or in the periphery circuits formed on the same substrate. The phenomena take place not entirely but locally on the exposure surfaces of the substrate 22, with an unsettled amount of evaporation and attaching of impurity. The variation of the threshold voltage of the MOS FET's deteriorates the yield of manufacturing the components or circuits including such the MOS FET's and the reliability of them manufactured.

SUMMARY OF THE INVENTION

Accordingly, an object of the present invention is to provide a manufacturing method of semiconductor devices having polycrystalline semiconductor layers doped with impurity in which it is prevented for doped impurity to evaporate from the semiconductor surface and to attach onto the exposed surface of the substrate.

According to the invention, there is provided a manufacturing method of semiconductor devices with polycrystalline semiconductor layers with doped impurity comprising: a step of forming a first polycrystalline semiconductor layer doped with impurity on a semiconductor substrate; and a step for forming a second polycrystalline semiconductor layer not doped with impurity on the first polycrystalline semiconductor layer.

DETAILED DESCRIPTION OF THE PREFERRED EMBODIMENTS

Figure 2A:
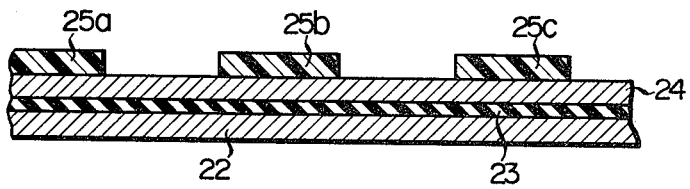
FIGS. 2A through 2E show the process of a conventional manufacturing method of the FIG. 1A device.
Figure 2B:
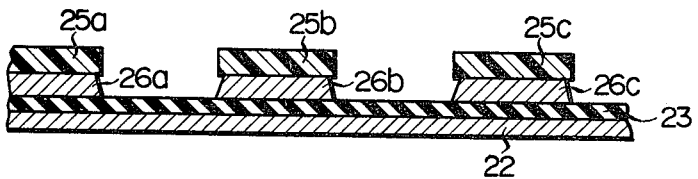
Figure 2C:
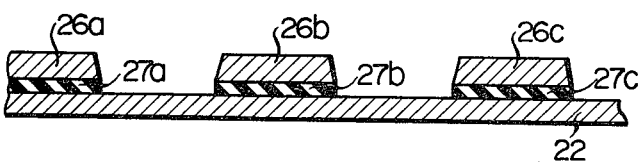
Figure 2D:
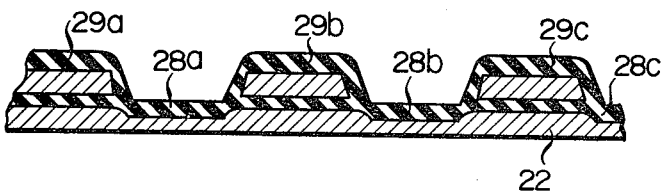

The manufacturing method of semiconductor devices according to the present invention will be briefed referring to FIGS. 2A to 2E; before the polycrystalline silicon layer 23 as shown in FIG. 2A is formed, a first polycrystalline silicon layer doped with impurity is formed on the first gate oxide layer 23 and then a second polycrystalline silicon layer not doped with impurity is formed on the first polycrystalline silicon layer. This method may remarkably reduce evaporation of the impurity from the first polycrystalline electrode when the second gate oxide layer is formed.

The description to follow is an embodiment of the invention which is the case that the present invention is applied to the manufacturing of the overlapping type charge coupled device as shown in FIGS. 2A to 2E.

Figure 2E:
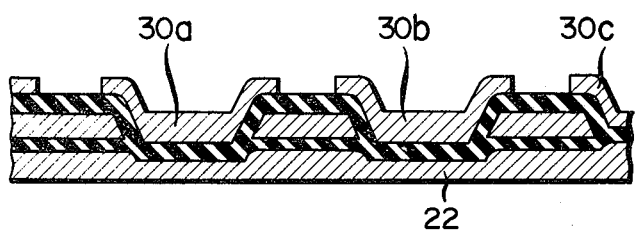
Figure 3A:
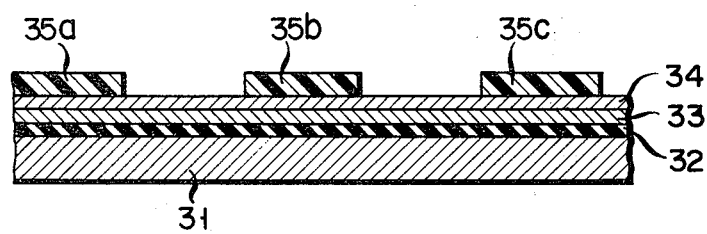
FIGS. 3A to 3E show the process of a manufacturing method of an overlapping type charge coupled device as shown in FIG. 1A according to the invention.
Figure 3B:
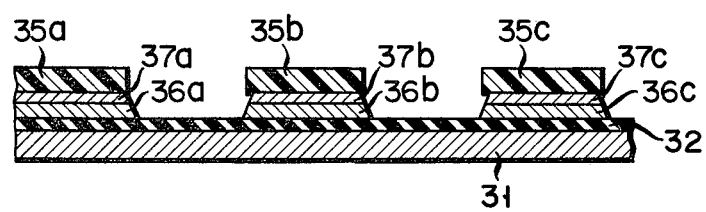
Figure 3C:
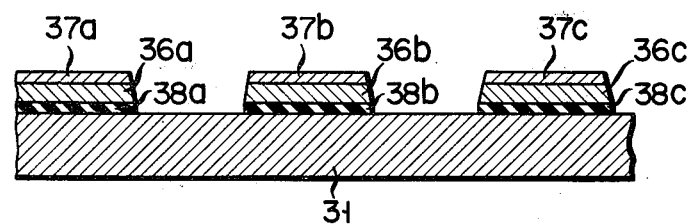
Figure 3D:
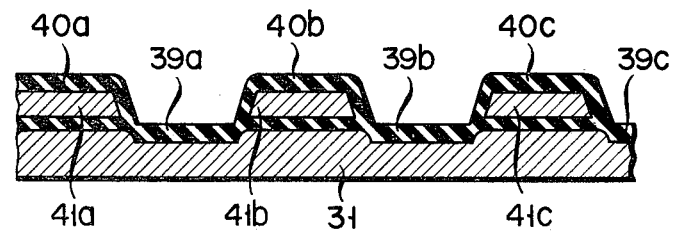
Figure 3E:
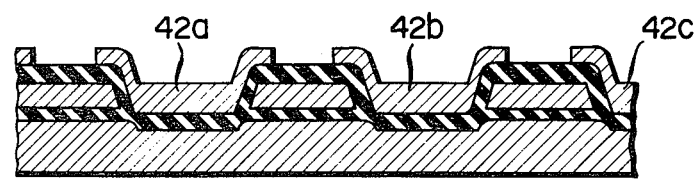

As shown in FIG. 3A, a first gate oxide layer 32 is formed on a p-type monocrystalline silicon substrate 31. A first polycrystalline silicon layer 33 doped with impurity at a desired density is formed on the first gate oxide layer 32, and then a second polycrystalline silicon layer without doped impurity 34 is formed on the first polycrystalline silicon layer 33. Photoresist layers 35a, 35b and 35c are patterned on the portions corresponding to the first polycrystalline silicon electrodes, by a photolithography. After this, the polycrystalline silicon layers 33 and 34 which are not covered with the photoresist layers are removed by, for example, the plasm etching method, using the photoresist layers 35a, 35b and 35c as an etching mask. This removal step forms on the first gate oxide layer 32 isolated polycrystalline silicon layers each including the polycrystalline silicon layers 36a, 36b and 36c with doped impurity and polycrystalline silicon layers 37a, 37b and 37c without doped impurity layered on the former, as shown in FIG. 3B. After the photoresist layers 35a, 35b and 35c are removed, the oxide layer is removed by the oxide etching using, for example, ammonium fluoride ($NH_4F$) and by using the polycrystalline silicon layer as the etching mask, while left are the oxide layers 38a, 38b and 38c under the polycrystalline silicon layer. See FIG. 3C. The next step thermal-oxidizes the thus processed semiconductor device in a high temperature oxide atmosphere to form second gate oxide layers 39a, 39b and 39c on the substrate 31 and oxide layers 40a, 40b and 40c on the polycrystalline silicon layer, respectively, as shown in FIG. 3D. In this thermal-oxidizing step, the polycrystalline silicon layers 37a, 37b and 37c not doped with impurity are doped with the impurity diffused from the polycrystalline silicon layer doped with impurity, with the result that first polycrystalline silicon electrodes 41a, 41b and 41c are formed each entirely doped with impurity. See FIG. 3D. Finally, second polycrystalline silicon electrodes 42a, 42b and 42c are formed on the second gate oxide layers 39a, 39b and 39c and partly on the oxide layers 40a, 40b and 40c, partly overlapping with the first polycrystalline silicon electrodes 41a, 41b and 41c, respectively, as shown in FIG. 3E. In this manner, an overlapping type charge coupled device with polycrystalline silicon electrodes with doped impurity is obtained as shown in FIG. 2E.

An explanation will be given of the method for forming the polycrystalline silicon layer 33 doped with impurity and that 34 not doped with impurity as shown in FIG. 3A.

One of the methods is the chemical vapor deposition method (CVD) by using thermal decomposition of silane ($SiH_4$). In this method, the polycrystalline silicon layer 33 doped with impurity such as P or B is produced by supplying phosphine ($PH_3$) or diborane ($B_2H_5$) to a reaction system. The polycrystalline silicon layer not doped with impurity 34 may be prepared by stopping the supply of phosphine or diborane. Another method is that a polycrystalline silicon layer not doped with impurity is first prepared and then impurity is diffused into the polycrystalline silicon layer through the thermal diffusion to form a polycrystalline silicon layer doped with impurity. The other method in place of the thermal diffusion method is an ion-injection method. In this case, the peak position of the concentration of the impurity distributed in the polycrystalline silicon layer in the direction of the thickness is controlled and the impurity concentration on the surface of the polycrystalline silicon layer is controlled to be almost the one usually included in the polycrystalline silicon substrate. In such a manner, the polycrystalline silicon layers 33 and 34 are formed as shown in FIG. 3A.

The plasma etching method may be employed for forming the polycrystalline silicon layers 36a, 36b, 36c, 37a, 37b and 37c as shown in FIG. 3B. A low temperature oxide layer may be used for the etching mask. Generally, the low temperature oxide layer is prepared at lower temperature than the polycrystalline silicon formation temperature. Accordingly, if the low temperature oxide layer is formed on the polycrystalline silicon layer not doped with impurity in FIG. 3A, a small amount of impurity is doped from the doped polycrystalline silicon layer 33 to the non-impurity polycrystalline silicon layer 34, and this impurity amount is negligible in practical use.

As described above, according to the method of the present invention, the doped polycrystalline silicon layer is covered with the non-impurity polycrystalline silicon layer. Therefore, at this initial stage of the thermal oxidation for formation of the second gate oxide layer, the impurity is not evaporated from the polycrystalline silicon layer and thus the attaching of the impurity evaporated on the substrate surface never takes place. The non-impurity polycrystalline silicon layers 37a, 37b and 37c are oxidized to have oxide layers formed in the surface layer. At the same time, the impurity from the doped polycrystalline silicon layers 36a, 36b and 36c is diffused into the non-impurity layers 37a, 37b and 37c. As a result, both polycrystalline layers which are doped and not doped with impurity become each a single layer entirely doped with impurity. Thus, the desired first polycrystalline silicon layers with low conductivity may be obtained.

From the foregoing description, it will be seen that the manufacturing method of the invention remarkably reduces variations of the threshold voltage of MOS FET's manufactured and of the voltage versus capacitance characteristic of the MOS capacitor, as compared with those by the conventional manufacturing method.

Figure 1A:
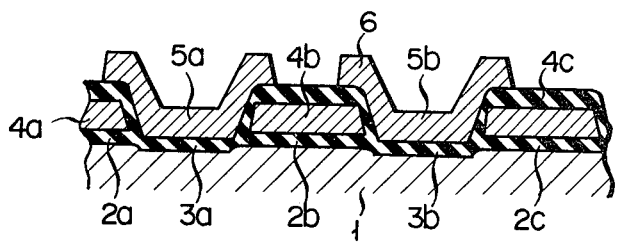
FIG. 1A shows a cross sectional view of an overlapping type charge coupled device with polycrystalline silicon double layers doped with impurity.
Figure 1B:
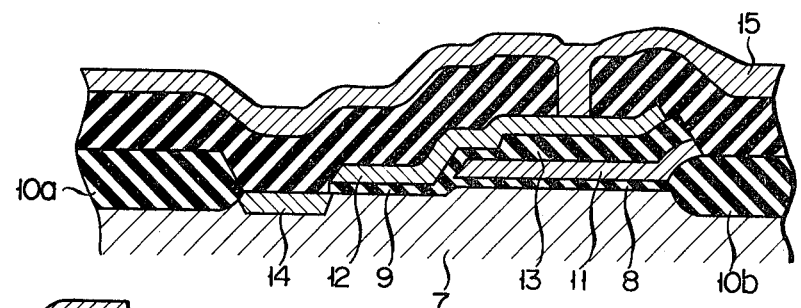
FIG. 1B shows a cross sectional view of one cell of a dynamic random access memory with polycrystalline silicon double layers doped with impurity.
Figure 1C:
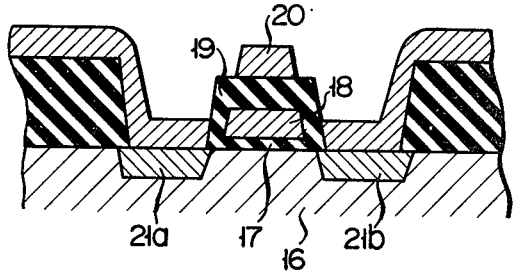
FIG. 1C shows a cross sectional view of one cell of an avalanche injection type MOS memory with polycrystalline silicon double layers doped with impurity.

As seen from FIGS. 3A to 3E, the overlapping type charge coupled device has two polycrystalline silicon electrodes of double layers. The second polycrystalline silicon electrode of the second layer may be substituted by a metal electrode made of aluminum, for example. Note also that the manufacturing method of the invention may be applied not only to the overlapping type charge coupled devices but also to the memory cells of the type shown in FIGS. 1B and 1C. The n-type monocrystalline silicon may also be used for the substrate.

The substrate may be one that a silicon epitaxial layer is formed on a monosilicon substrate or a sapphire substrate.

While the description heretofore made relates to the manufacturing method of the device with the doped polycrystalline silicon layer in the MOS IC of LSI version, the invention may be applied to the semiconductor devices manufactured by the bipolar technique. In the bipolar version, the case which is improved whom the invention is applied is that the doped polycrystalline silicon layer is exposed to the atmosphere prior to the oxidation step, thus possibly occurrence of the impurity evaporation. The invention involves in its application molybdenum silicide ($MoSi_2$) and the like which are expected to be used in place of polycrystalline silicon. Molybdenum silicide has similar natures of polycrystalline silicon, for example, good heat-resistivity, easy manufacturing, low resistivity and easy oxidation. Particularly in the molybdenum silicide case, evaporation of molybdenum takes place in the oxidation step. Therefore, the application of the invention to it is particularly effective, with the first layer of $MoSi_2$ and the second layer of the undoped polycrystalline layer.

What we claim is:

1. A manufacturing method of semiconductor devices having polycrystalline semiconductor layer doped with impurity, comprising the steps of:
    forming a first polycrystalline semiconductor layer doped with impurity on a substrate;
    forming a second polycrystalline semiconductor layer undoped with impurity on said first polycrystalline semiconductor layer;
    removing selectively said first and second polycrystalline semiconductor layers from the substrate to expose portions of the substrate; and
    thermal-oxidizing the second polycrystalline semiconductor layer undoped with impurity and some exposed portions of the substrate, the impurities in the first polycrystalline semiconductor layer being diffused into the second polycrystalline semiconductor layer during the thermal-oxidizing step.

2. A manufacturing method of semiconductor devices according to claim 1, in which said first polycrystalline semiconductor is formed by CVD method supplying impurity to a reactor system, and said second polycrystalline semiconductor layer is formed by CVD method supplying no impurity to the reactor system.

3. A manufacturing method of semiconductor devices according to claim 1, in which said first polycrystalline semiconductor layer is formed by doping impurity into said polycrystalline layer undoped with impurity, through thermal diffusion.

4. A manufacturing method of semiconductor devices according to claim 1, in which said first and second polycrystalline semiconductor layers are each formed by controllingly ion-injection impurity the polycrystalline semiconductor layer undoped with impurity.

5. A manufacturing method of semiconductor devices according to claim 1, in which said polycrystalline semiconductor is polysilicon.

* * * * *